United States Patent [19]

Haus et al.

[11] 4,096,446
[45] Jun. 20, 1978

[54] DISTRIBUTED FEEDBACK DEVICES WITH PERTURBATIONS DEVIATING FROM UNIFORMITY FOR REMOVING MODE DEGENERACY

[75] Inventors: Herman Anton Haus, Lexington, Mass.; Charles Vernon Shank, Holmdel, N.J.

[73] Assignee: Bell Telephone Laboratories, Incorporated, Murray Hill, N.J.

[21] Appl. No.: 654,339

[22] Filed: Feb. 2, 1976

[51] Int. Cl.$^2$ .............................................. H01S 3/00
[52] U.S. Cl. .............................. 331/94.5 C; 350/96.13
[58] Field of Search ................. 331/94.5 C, 94.5 H; 357/16, 18; 350/96 WG

[56] References Cited

U.S. PATENT DOCUMENTS

| | | | |
|---|---|---|---|
| 3,760,292 | 9/1973 | Kogelnik et al. | 331/94.5 C |
| 3,795,434 | 3/1974 | Ash | 350/96 WG |
| 3,891,302 | 6/1975 | Dabby et al. | 350/96 WG |
| 3,970,959 | 7/1976 | Wong et al. | 331/94.5 C |

OTHER PUBLICATIONS

Alferov et al., Soviet Physics–Semiconductors, vol. 8, No. 10, Apr. 1975, pp. 1321–1322.
Shubert, J. of Applied Physics, vol. 45, No. 1, Jan. 1974, pp. 209–215 +p. 2811 (ibid, Jun. 1974).

*Primary Examiner*—Stanley D. Miller, Jr.
*Assistant Examiner*—James W. Davie
*Attorney, Agent, or Firm*—Wilford L. Wisner; Daniel D. Dubosky

[57] ABSTRACT

Distributed feedback devices such as distributed feedback lasers are modified by introduction of a central coupling strength discontinuity or other deviation from uniform nature of the distributed perturbations, in order to promote the transmission of oscillation of a single mode in preference over the nearest redundant modes. The class of deviations from uniform coupling strength may be mathematically termed antisymmetric deviations, because they are deviations about the midpoint of the perturbation pattern which result in a distinction of effect of the two halves of the pattern, taking either half as a reference pattern by itself.

3 Claims, 8 Drawing Figures

DISTRIBUTED FEEDBACK DEVICES WITH PERTURBATIONS DEVIATING FROM UNIFORMITY FOR REMOVING MODE DEGENERACY

BACKGROUND OF THE INVENTION

This invention relates to distributed feedback devices such as distributed feedback lasers and to improvements thereof which remove mode degeneracy.

The first distributed feedback devices, and particularly distributed feedback lasers, were proposed by one of us, Mr. C. V. Shank and Mr. H. W. Kogelnik, in Pat. No. 3,760,292 issued Sept. 18, 1973. The realization of such a laser, as described in that patent, utilizes the Bragg reflection for a spatially periodic variation in index of refraction, gain coefficient or waveguide propagation constant, the most typical example of the latter being a variation in guide thickness. Numerous other distributed feedback lasers have been described in the literature, for example, by H. W. Yen et al in the article entitled "Optically Pumped GaAs Waveguide Lasers With a Fundamental 0.11$\mu$ Corrugation Feedback," *Optics Communications*, Volume 9, page 35 (September 1973), by E. J. Staples et al, in their article, 1974 *Ultrasonic Symposium Proceedings*, page 245, and by J. S. Schoenwald et al, ibid., page 253.

Distributed feedback structures have the advantage of providing better frequency selectivity of the mode of oscillation than resonators formed by partially transmissive reflectors at the ends of the structure. Furthermore, periodic structures with distributed feedback have other applications. Bandpass transmission and reflection filters may be constructed using passive structures that employ Bragg reflections. For example, see the article by R. C. M. Li et al, 1974 *Ultrasonic Symposium Proceedings*, page 257. The reflection filter formed by such a structure is the equivalent of a mirror reflecting a band of frequencies.

The range of application now foreseen for the distributed feedback principle motivates a study of variations of the distributed feedback design with the objective of obtaining improved performance for many uses. One of the objectives of concern in this case is the mode spectrum of a typical distributed feedback laser, as analyzed by Kogelnik and Shank, *Journal of Applied Physics*, Volume 43, page 2327 (1972). That mode spectrum exhibits a gap at a center frequency. Modes of equal threshold occur symmetrically on the two sides of this gap. This threshold degeneracy is a disadvantage in practical applications in which single mode operation at a predictable frequency is desired, since one cannot predict which of the symmetrically placed modes will take hold first and control the operation of the device.

It would be desirable to obtain distributed feedback devices not characterized by such mode degeneracy.

SUMMARY OF THE INVENTION

According to our invention, distributed feedback devices, particularly distributed feedback lasers, are improved to remove mode degeneracy by causing the feedback-producing perturbations to depart from uniform coupling strength near or about the midpoint of the structure. The best specific embodiment at present is a step discontinuity in coupling strength at the midpoint; but other deviations from uniformity, which we mathematically classify as antisymmetric about the midpoint, vary the effective coupling constant about the midpoint, typically in a "tapered" fashion.

BRIEF DESCRIPTION OF THE DRAWINGS

Further features and advantages of our invention will become apparent from the following detailed description, taken together with the drawings, in which.

DESCRIPTION OF ILLUSTRATIVE EMBODIMENTS

Figure 1:
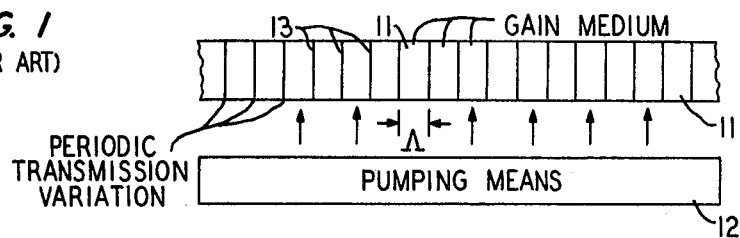
FIG. 1 shows a schematic representation of the prior art devices.

FIG. 1 shows schematically the prior art distributed feedback structures which are uniform and periodic. That is, the coupling strength of each perturbation 13 in the gain medium 11 is equal to that of all the others; and all of the spacings are equal. These perturbations 13 may be previously established in the gain medium 11, typically a waveguide; or they may be produced by an interference pattern of the light from the pumping means 12.

Looked at as a passive structure, distributed feedback structure 11, 13 acts as a resonator by providing small incremental reflections at each perturbation 13, which is, for example, a plane or region of maximum gain or index of refraction. These incremental reflections add to give the needed positive feedback for a laser oscillator or regenerative amplifier.

The problem of the embodiment of FIG. 1 is that modes of equal oscillation threshold occur symmetrically on the two sides of the center frequency of the structure. This threshold degeneracy is a disadvantage in practical applications in which single mode operation is desired, as discussed above.

Figure 2:
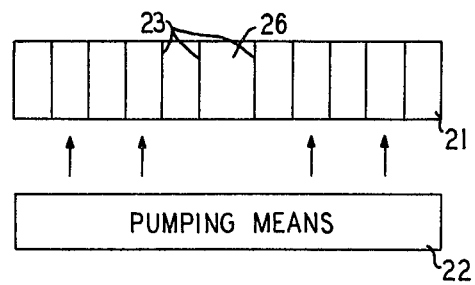
FIG. 2 shows a corresponding schematic representation of the modified device with a step discontinuity in coupling strength, which appears as a step in perturbation spacing.

The modification in FIG. 2 overcomes this degeneracy by modifying the uniformity of the coupling strength of the perturbations. In the special case of FIG. 2, a quarter wavelength extra spacing is inserted between the two equal halves of the otherwise uniform distributed feedback structure. This discontinuity 26 occurs centrally among the perturbations 23 of the gain medium 21, which is pumped by pumping means 22.

The effect of the central discontinuity is to cause the waves propagating from each half of the medium toward the other to see the perturbations at times of changed intensity, so that, intuitively, one sees that there is a changed tendency of the whole structure to transmit the central, resonant frequency that can be calculated from the perturbation spacing. Hence, the discontinuity can be called a variation, or "taper", of $\kappa$, the coupling strength.

The insertion of the quarter wavelength extra spacing, which makes the central spacing 50 percent larger than all the other spacings, makes possible a mode of the structure within the stop bands of the two uniform halves of the device. The field of that new mode decays exponentially from the central segments into the uniform distributed feedback structures on either side. This particular mode possesses an external Q, which can be much higher than that of the uniform structure with the same product of coupling constant and length, that is $\kappa L$, where $\kappa$ is the feedback parameter, here generally termed coupling strength, of the above-cited article by Kogelnik and Shank.

We view this central discontinuity mathematically as one special case of an antisymmetric taper of $\epsilon$. Our analysis shows that it is a property of all such structures that they support a mode at the center frequency of the local stop bands.

Moreover, we have discovered that this mode has a particularly low threshold when the distributed feedback device is pumped as shown in FIG. 2 in order to provide a laser. On the other hand, if the embodiment of FIG. 2 were to be modified to be a transmission filter, i.e., an input wave approaches from the left of medium 21 and no pumping means 22 is employed, this mode is responsible for a particularly narrow transmission band.

The mathematical analysis of our modified distributed feedback structures can be quite complicated. Two different approximate analyses have been carried out to provide some insight into the range and variety of structures that will promote a single mode or suppress mode degeneracy.

THE TAPERED STRUCTURE

In this section we set up the basic equations for a "tapered" distributed feedback structure. Our further analysis, not set out in detail, demonstrates that a structure with an "antisymmetric taper" of the feedback parameter $\kappa$ and the Bragg frequency parameter $\delta$ can support a mode at a frequency that may be within the "local stop bands" of the tapered structure. Such a mode has fields that peak at the center of the structure and decay exponentially to either side. As a result, the mode possesses a high external Q, a requirement for low threshold gain.

The fundamental equations of the distributed feedback laser are $$- R' + (\alpha - J\delta)R = j\kappa S \qquad (1)$$

$$S' + (\alpha - j\delta)S = j\kappa^* R \qquad (2)$$

Here $\alpha$ is the gain constant, $\delta$ is the "Bragg" parameter indicating deviation of the propagation constant $\beta(>0)$ from the Bragg condition $$\delta = \beta - \pi/\Lambda \qquad (3)$$

where $\Lambda$ is the spatial period of the feedback "corrugation", and $\kappa$ is the feedback parameter. For a spatially periodic index variation of amplitude $n_1$ $$|\kappa| = \pi n_1/\lambda_o \qquad (4)$$

Equations (1) and (2) hold for any loss free distributed feedback. The condition $\delta = 0$ defines the center frequency of the "stop band". If $\Lambda$ is a function of position, then the center frequency of the "stop band" is also a function of position.

A taper of $\kappa$ is produced by variation mainly in the height or strength of the periodic perturbation. A taper of $\delta$, or a "chirp", is produced by a spatial variation of the phase velocity or by making $1/\Lambda$ depend on $z$, the position along the medium. We find the variation, or "taper", or to be more useful than the chirp. Taking a perturbation of equation (3) from a frequency $\omega_o$ to a frequency $\omega = \omega_o + \Delta\omega$, one has $$\delta(z) = \delta_o(z) + \frac{\Delta\omega}{v_g}, \qquad (5)$$

where $\delta_o(z) = \beta_o - \pi/\Lambda$, the Bragg parameter at the frequency $\omega_o$.

The frequency dependence of $\kappa$ is usually too weak to matter.

Our analysis shows, that with a variation of $\kappa$, a transmitted mode can exist at the center frequency of the structure. The best way of demonstrating the promoting of a single mode is to look at special cases. In the next section we consider a special case of an antisymmetric taper, predominantly of $\kappa$, namely, an antisymmetric step in the perturbations at the center of the structure.

STRUCTURE WITH A STEP OF $\kappa$

An antisymmetric step of $\kappa$ is produced by a sign change of $\kappa$ as one passes from one side of the discontinuity to the other side. We recall that $\kappa$ has a reference phase that is a constant in a uniform structure. If a uniform distributed feedback structure is cut in its middle, a section of length equal to one-half wavelength of the corrugation, or one-quarter wavelength of the optical wavelength, removed, and then the two sections recombined, one has changed the phase of $\kappa$ by 180°, and the phase of the optical wave at which it sees the perturbation by 90°, as one passes from one side of the structure to the other side. In this case the mode of interest is at the center of the stop bands of both halves of the structure. The decay of the fields from the center of the structure is fastest in this case, leading to the lowest value of power escaping from the structure for a given average intensity in the structure.

Figure 8:
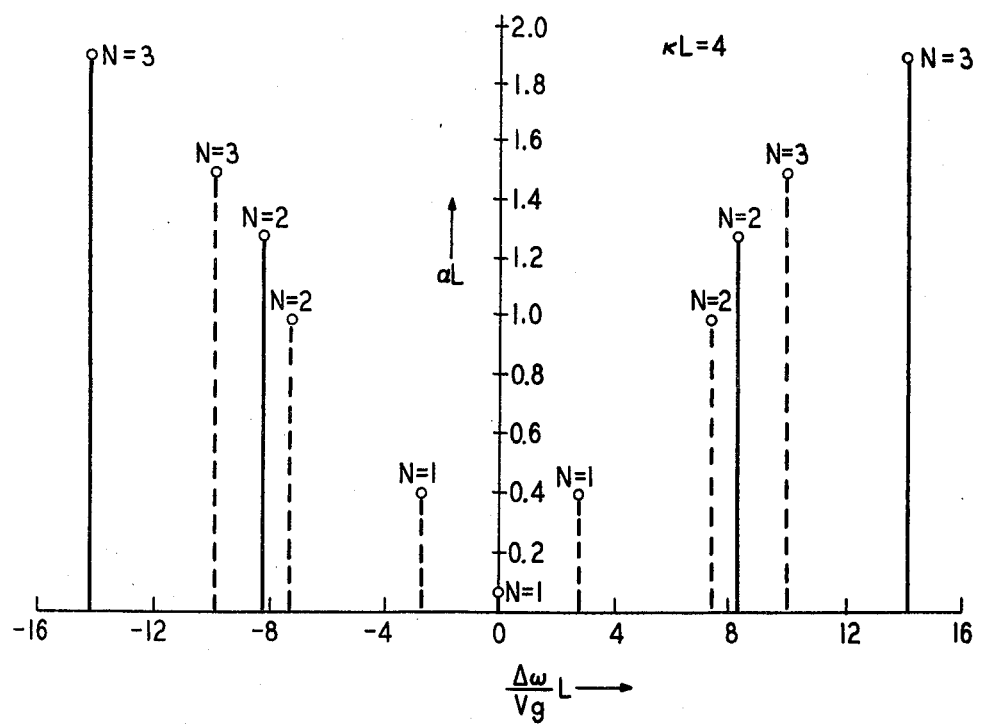
FIG. 8 is a diagram showing the shift in mode spacing resulting from the invention.

FIG. 8 shows the modes, as solid lines, of a stepped-$\kappa$ structure and, for comparison, those, as dotted lines, of a uniform structure. Both structures are of the same overall length L, and have $\kappa L = 4$. It is immediately apparent that the stepped-$\kappa$ structure has no threshold degeneracy, as well as a much better threshold discrimination between the fundamental mode (N=1) and the first higher order mode (N=2). Also, one may note that the frequency separation between the dominant mode and the first higher order mode of the stepped-$\kappa$ structure is much greater than, nearly twice, that of the uniform structure. In our analysis, there is one novel feature that is noteworthy. For the uniform structure of FIG. 1, the solutions had spatial periodicity. Hence a node of R at $z = -L/2$ had a slope $|R'|$ equal to the slope at the node at $z = +L/2$: the power entering via S at $z = L/2$ was equal to that leaving at $z = -L/2$. When there is a taper, solutions are found that are not symmetric with respect to $z = 0$. Hence, the zero-order solution satisfying R = 0 at $z = \pm L/2$ will not be lossless in general. The solution will have a natural decay, or growth-rate. This does not prevent one from using symmetric solutions for the starting point of a perturbation analysis. It should not be called "lossless", but "high Q" instead. The threshold is still determined by equating the external Q to the gain Q. With this in mind the generalized procedure for determining the modes of the distributed feedback laser is:

(a) One finds the equivalent high-Q mode which may be approximated by a perfect standing wave-solution of R (or S) and a nonperfect standing wave of S (or R), with power entering and leaving the structure via S (or R).

(b) The external Q of the actual structure, with S and R "escaping" at the two ends, is obtained from a perturbation analysis; at a node of R.

(c) Refinements to determine threshold can be carried out.

GENERAL STRUCTURES WITH ANTISYMMETRIC TAPER

We can now apply our approximate method of modeand threshold-determination to structures with more general variations of coupling strength. We believe them generally to be describable as "antisymmetric tapers". In fact, the essence of our invention is that the design of high-Q structures with a mode spectrum symmetric about a center frequency must be accomplished with an antisymmetric taper $\kappa$ and substantially no taper of $\delta$, ($\delta_o = 0$).

Some simple criteria for the construction of high Q - low threshold - laser structures are as follows:

(a) In order to achieve a mode with a resonance frequency independent of the structure length one must use an antisymmetric taper of $\delta$ and $\kappa$.

(b) The external Q is highest, and the threshold gain lowest, when there is no taper of $\delta$.

(c) Of any taper with a given maximum value of coupling coefficient $\kappa$, the antisymmetric step of $\kappa$ gives the highest $Q_{ext}$, lowest threshold gain. We believe that the above criteria are of general validity, even though our analysis has been of more limited scope.

We have shown that an antisymmetric taper of $\kappa$ and $\delta_o(z)$ breaks the threshold degeneracy found in uniform DFB lasers. Our approximate analysis has been tested on the uniform prior art structure and the stepped-$\kappa$ structure of FIG. 2 with good results for $\kappa L > 2$.

Figure 3:
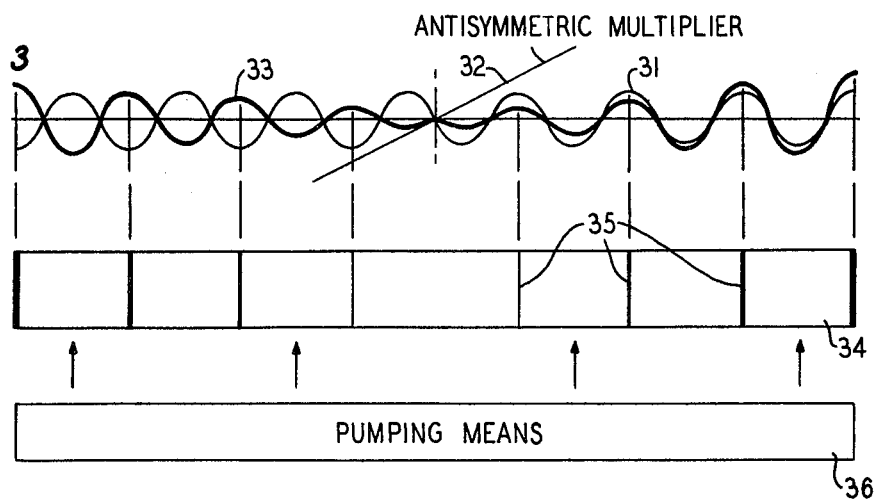
FIG. 3 shows another schematic representation, magnified in scale, which employs a so-called antisymmetric multiplier to determine a taper of the coupling strength about the midpoint.

In FIG. 3 there is shown another way, slightly more complex, to remove mode degeneracy in the distributed feedback structure. Let us suppose for a moment that the sine wave curve 31 represents the periodic nature of the strength and spacing of perturbations that would be employed in a prior art comparable distributed feedback structure. To remove this mode degeneracy, we now modify the strength and spacing of those perturbations by multiplying curve 31 by the antisymmetric multiplier curve 32 which is a straight line through the origin of the sine wave curve 31; more specifically, it has positive values to the right of the midpoint of the intended feedback structure and has negative values monotonically increasing in the negative direction of the left-hand side of the midpoint of the structure. When the multiplication is carried out, the periodic curve 31 now becomes the nearly periodic, varying amplitude curve 33. The curve 33 is not capriciously aperiodic; but, indeed, is highly regular and quite apparently has a sort of discontinuity at the origin. In fact, curve 33 may remind the mathematically inclined reader of the general shape of Bessel functions. The peak strength of the perturbations in the active medium 34 occurs at spacings along the length thereof corresponding to the spacings of the positive peaks of curve 33, as shown in FIG. 3. Here again, there is also apparently an extra large gap at the center of the structures; but it is noted that the strength of the perturbations 35 varies continuously and monotonically away from the midpoint of the structure.

This variation is termed "antisymmetric" rather than an apparently physically symmetric variation because of the use of the antisymmetric multiplier 32, which produces the apparent central discontinuity. Here again, if a pumping means 36 is employed, the device is a distributed feedback laser. If an input wave is supplied to medium 34 from one end as shown, the structure may be an amplifier, if pumped, or a filter if not pumped.

Figure 4:
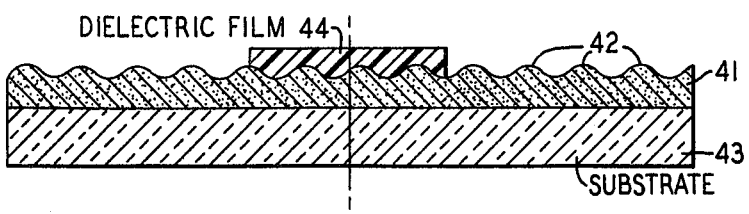
FIGS. 4 and 5 show modified embodiments employing central discontinuities which encompass several perturbations about the midpoint of the device.
Figure 5:
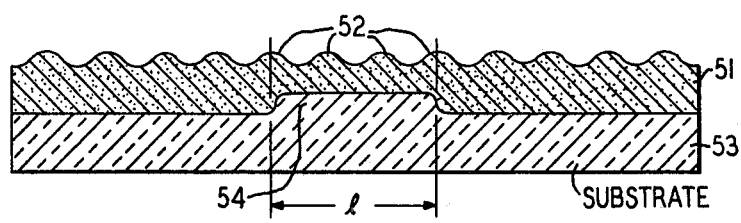

The embodiments of FIGS. 4 and 5 are perhaps more closely analogous to those of FIG. 2 than to FIG. 3. The dielectric waveguide 41 on FIG. 4 has strictly periodic thickness perturbations 42 and is mounted upon a lower index substrate 43, as is conventional. The modification according to the invention is supplied by a centrally located body of dielectric film 44 which spans, not just a quarter-wavelength section in the center of the structure, but several perturbations extending specifically from the peak of one to the valley of another, which are equally spaced from a midpoint of the entire structure. This dielectric loading upon the perturbations reduces their apparent strength and even slightly modifies the propagation constant and therefore their apparent spacing. We believe it to provide predominantly a taper of $\kappa$, the coupling strength.

A similar effect in FIG. 5 is achieved by diminishing the thickness of the waveguide 51 in a central section 54. In this case, the perturbations 52 are not reduced in height but their coupling strength is significantly changed because of the greater confinement of the light by the substantial thinning of the waveguide 51 and corresponding intrusion of a substrate 53.

According to our approximate analysis, we have found that the structures of FIGS. 4 and 5 should also remove mode degeneracy but are not expected to be as effective as the simple central discontinuity of FIG. 2.

Figure 6:
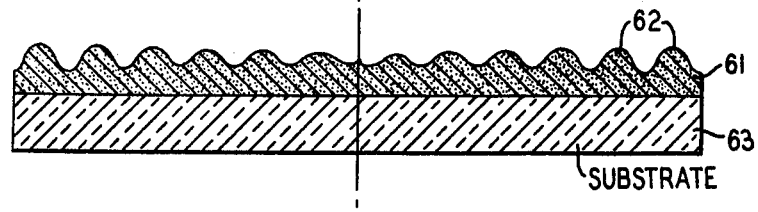
FIG. 6 shows a pictorial modification of the embodiment of FIG. 3 employing perturbations in guide thickness.

The embodiment of FIG. 6 is illustratively shown as a passive structure and is a specific implementation of the schematic version of FIG. 3. Here the perturbations 62 are produced by variation in thickness of the waveguide 61 as achieved by the use of an antisymmetric multiplier. It is expected that the performance of such an antisymmetric taper will be less effective than the performance of a version employing the stepped central discontinuity.

Figure 7:
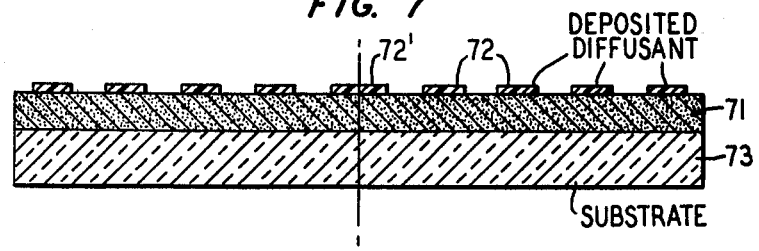
FIG. 7 shows a pictorial modification of the embodiment of FIG. 2 employing periodic loading on the surface of the waveguide.

For that reason, a specific pictorial implementation of the schematic embodiment of FIG. 2 is shown in FIG. 7. Here the waveguide 71 is disposed on lower index substrate 73 and the perturbations 72 are specifically strips 72 of metal diffusant, for instance, titanium strips which can be diffused into illustratively a lithium niobate waveguide 71. The central diffusion strip 72' is 50 percent broader than the others thereby producing the step spacing discontinuity schematically illustrated in FIG. 2.

The variation in laser mode spacing and laser embodiment according to FIG. 2 as compared to the prior art laser embodiment of FIG. 1 is illustrated in FIG. 8; but FIG. 8 shows trends that are generally applied to the other embodiments. The solid lines represent modes in the modified structure and the dotted lines represent modes in the prior art structure. It will be noted that the N = 1 mode is now centrally located in the frequency spectrum of the device instead of there being two equally spaced modes as the first modes on either side of that central frequency. The mode spacing has also been greatly increased by a phenomena similar to selection rules of quantum mechanics. In other words, the permissible oscillation modes or transmission modes of a filter have been approximately 50 percent eliminated by the modification of the structure. Furthermore, the exact mathematical solution of the structure shows an even slightly different increase in spacing than merely double.

The representations of FIG. 8 are for $\kappa L = 4$; but this value has only a marginal effect upon the properties of the change in modes produced by the invention.

What is claimed is:

1. An optical frequency device for the stimulated emission of radiation comprising an active medium and a feedback mechanism, means for creating a population inversion in said active medium, said feedback mechanism comprising perturbations in the transmission characteristics of the medium substantially continuously along the length thereof, said perturbations having a feedback parameter, $\kappa$, and a spatial periodicity of $\lambda_o/2$ where $\lambda_o$ is the wavelength in the medium of an optical wave at the Bragg frequency, said perturbations departing from uniformity in a step-wise change about the midpoint of the length of the medium sufficiently to produce an antisymmetric variation in the feedback parameter, $\kappa$, said step-wise change in perturbations including an extra quarter-wavelength space between two central perturbations, where the wavelength is the wavelength of the optical wave, thereby promoting the amplification of a single mode at $\lambda_o$ over the amplification of the adjacent modes.

2. An optical frequency device for the stimulated emission of radiation comprising an active medium and a feedback mechanism, means for creating a population inversion in said active medium, said feedback mechanism comprising perturbations in the transmission characteristics of the medium substantially continuously along the length thereof, said perturbations having a feedback parameter, $\kappa$, and a spatial periodicity of $\lambda_o/2$ where $\lambda_o$ is the wavelength in the medium of an optical wave at the Bragg frequency, said perturbations departing from uniformity via an antisymmetrical taper of coupling strength about the midpoint of the length of the medium sufficiently to produce an antisymmetric variation in the feedback parameter, $\kappa$, said antisymmetrical taper of coupling strength conforming to a variation equal to a sine wave variation multiplied by a straight line variation passing through zero at the midpoint, thereby promoting the amplification of a single mode at $\lambda_o$ over the amplification of the adjacent modes.

3. An optical frequency device for the stimulated emission of radiation comprising an active medium and a feedback mechanism, means for creating a population inversion in said active medium, said feedback mechanism comprising perturbations in the transmission characteristics of the medium substantially continuously along the length thereof, said perturbations having a feedback parameter, $\kappa$, and a spatial periodicity of $\lambda_o/2$ where $\lambda_o$ is the wavelength in the medium of an optical wave at the Bragg frequency, said perturbations comprising metallic means for periodically loading the active medium, the perturbations departing from uniformity via a central step change about the midpoint of the length of the medium sufficiently to produce an antisymmetric variation in the feedback parameter, $\kappa$, said central step change being an increase in metallic loading width of about 50 percent, thereby promoting the amplification of a single mode at $\lambda_o$ over the amplification of the adjacent modes.

* * * * *